United States Patent [19]

Skill

[11] 4,388,672
[45] Jun. 14, 1983

[54] PRINTED CIRCUIT BOARD ASSEMBLY

[75] Inventor: Richard T. Skill, Austin, Tex.

[73] Assignee: Motorola Inc., Schaumburg, Ill.

[21] Appl. No.: 259,751

[22] Filed: May 1, 1981

[51] Int. Cl.³ .............................................. H05K 1/14
[52] U.S. Cl. ..................................... 361/412; 361/395; 361/415
[58] Field of Search ............... 361/415, 395, 398, 412, 361/413, 414; 174/68.5

[56] References Cited

U.S. PATENT DOCUMENTS

| 3,010,052 | 11/1961 | Heath et al. | 361/412 X |
| 3,147,402 | 9/1964 | Hochstetler | 361/395 X |
| 3,814,990 | 6/1974 | Waramn et al. | 361/412 X |
| 3,831,063 | 8/1974 | Keough | 361/412 |
| 4,227,238 | 10/1980 | Saito | |
| 4,335,272 | 6/1982 | Pittenger | 174/68.5 |
| 4,339,628 | 7/1982 | Marcantonio et al. | 361/412 X |

FOREIGN PATENT DOCUMENTS

| 454998 | 12/1966 | Switzerland | 361/415 |
| 1019093 | 2/1966 | United Kingdom | 361/415 |

OTHER PUBLICATIONS

Motorola Application, Latasiewicz AP-80205, U.S. S/N 136,010.
Motorola Application, Bell AP-79150, U.S. S/N 108,433.
Motorola Service Manual, Aug. 1980 Entitled "1980 Ford Remote CB Radio 80-2" p. 15 and photos A-D.

Primary Examiner—R. R. Kucia
Attorney, Agent, or Firm—Phillip H. Melamed; James S. Pristelski; James W. Gillman

[57] ABSTRACT

A printed circuit board assembly usable in a transceiver microphone is disclosed. The assembly comprises a first printed circuit board having components mounted thereon which is fixed to one side of a circuit board carrier by retaining tangs. Second and third printed circuit boards also having components thereon are mounted on an opposite side of the circuit board carrier also by retaining tangs. The first circuit board is connected to the second and third circuit boards via pluralities of bare jumper wires extending between end portions of the first circuit board and adjacent end portions of the second and third circuit boards. The carrier is substantially planar and has integral end projections which form associated notches for receiving each of the jumper wires.

10 Claims, 3 Drawing Figures

PRINTED CIRCUIT BOARD ASSEMBLY

BACKGROUND OF THE INVENTION

The present invention relates generally to the field of circuit board assemblies in which at least two circuit boards are electrically interconnected therebetween. More specifically, the present invention relates to a printed circuit board assembly comprising a plurality of electrically interconnected circuit boards which are assembled into a compact, inexpensive circuit board assembly for use in a microphone transceiver.

Only a limited amount of space is available for the mounting of electrical circuit components and printed circuit boards in a transceiver microphone chassis. Typically a large number of electrical circuit components must be interconnected and mounted in the microphone chassis and the easiest way of accomplishing this is to mount these components on printed circuit boards. When several separate printed circuit boards must be utilized in the microphone chassis, there exists the problem of interconnecting these circuit boards to form the desired printed circuit board assembly.

Some prior printed circuit board assemblies have utilized flexible multiconductor flat cables to provide the interconnections between a plurality of circuit boards in a microphone chassis. This solution has not proved to be cost effective due to the relatively high cost of the flat flexible cable connections. In some instances bare jumper wires have been utilized to provide electrical interconnections between printed circuit boards. Typically, this technique has not been utilized in a microphone chassis which requires small geometries since the bare jumper wires must be positioned relatively close together and therefore the problem of having the jumper wires short together is encountered. Some prior circuit assemblies have attempted to utilize edge grooves in printed circuit boards as guides for bare jumper wires which interconnect different circuit boards. However, this technique does not appear to be feasible when circuit boards are to be mounted in a stacked or back to back relationship in order to minimize the space taken up by the plurality of circuit boards. Thus while the utilization of bare jumper wires has avoided the cost of the flat flexible cable connections, other drawbacks have prevented the use of bare jumper wires for interconnecting the circuit boards in a microphone chassis.

SUMMARY OF THE INVENTION

An object of the present invention is to provide an improved circuit board assembly which overcomes the above mentioned deficiencies of the prior art and thereby provides a compact and inexpensive circuit board assembly in which a plurality of circuit boards are electrically interconnected.

A more specific object of the present invention is to provide an improved printed circuit board assembly having a plurality of circuit boards electrically interconnected by bare jumper wires wherein a circuit board carrier is provided with integral end projections that aid in the manufacturing of the assembly and ensure the proper positioning of the bare jumper wires.

In one embodiment of the present invention a circuit board assembly is provided, comprising: at least first and second substantially planar circuit boards having conductive metallizations thereon, each of said circuit boards having a top surface and a bottom surface, some non-planar electrical components mounted on the top surface of each circuit board; an electrically insulated circuit board carrier having raised peripheral shoulders substantially surrounding an effective planar central portion of said carrier, said first and second circuit boards mounted substantially back to back on said raised peripheral shoulders such that said bottom surfaces of said circuit boards are spaced apart from and face each other; said first and second circuit boards electrically interconnected by a plurality of jumper wire elements extending therebetween and soldered to adjacent end portions of each of said first and second circuit boards, and wherein said circuit board carrier has a guide portion formed therein at an end of said carrier adjacent to said adjacent end portions of said first and second circuit boards, said guide portion comprising a plurality of individual spaced projections extending from said adjacent end of said circuit board carrier, said projections forming notches therebetween with each of said jumper wire elements positioned in an associated one of said notches and therefore being spaced apart by said projections, whereby a compact, inexpensive circuit board assembly is provided.

Essentially, a substantially planar circuit board carrier having integral end projections is utilized to carry several circuit boards stacked back to back that are electrically interconnected by bare jumper wires. The integral end projections of the carrier form associated notches that aid in forming the assembly of the present invention and ensure that the bare jumper wires do not short together. The assembly of the present invention is constructed by providing a single master circuit board having several break away runner portions mechanically interconnecting separate circuit boards which are electrically interconnected by bare jumper wires. After wave soldering the master circuit board the runner portions are removed and one of the circuit boards is fixed to the carrier and another of the circuit boards is bent through approximately 180 degrees while the bare jumper wires are positioned in notches formed by the integral projections. Then the other circuit board is fixed to the carrier to form a compact circuit board assembly comprising a pair of substantially parallel aligned circuit boards. Through the use of the above described construction method of the present invention, the improved circuit board assembly described herein is provided.

BRIEF DESCRIPTION OF THE DRAWINGS

For a more complete understanding of the present invention reference should be made to the drawings, in which.

DESCRIPTION OF THE PREFERRED EMBODIMENT

Figure 1:
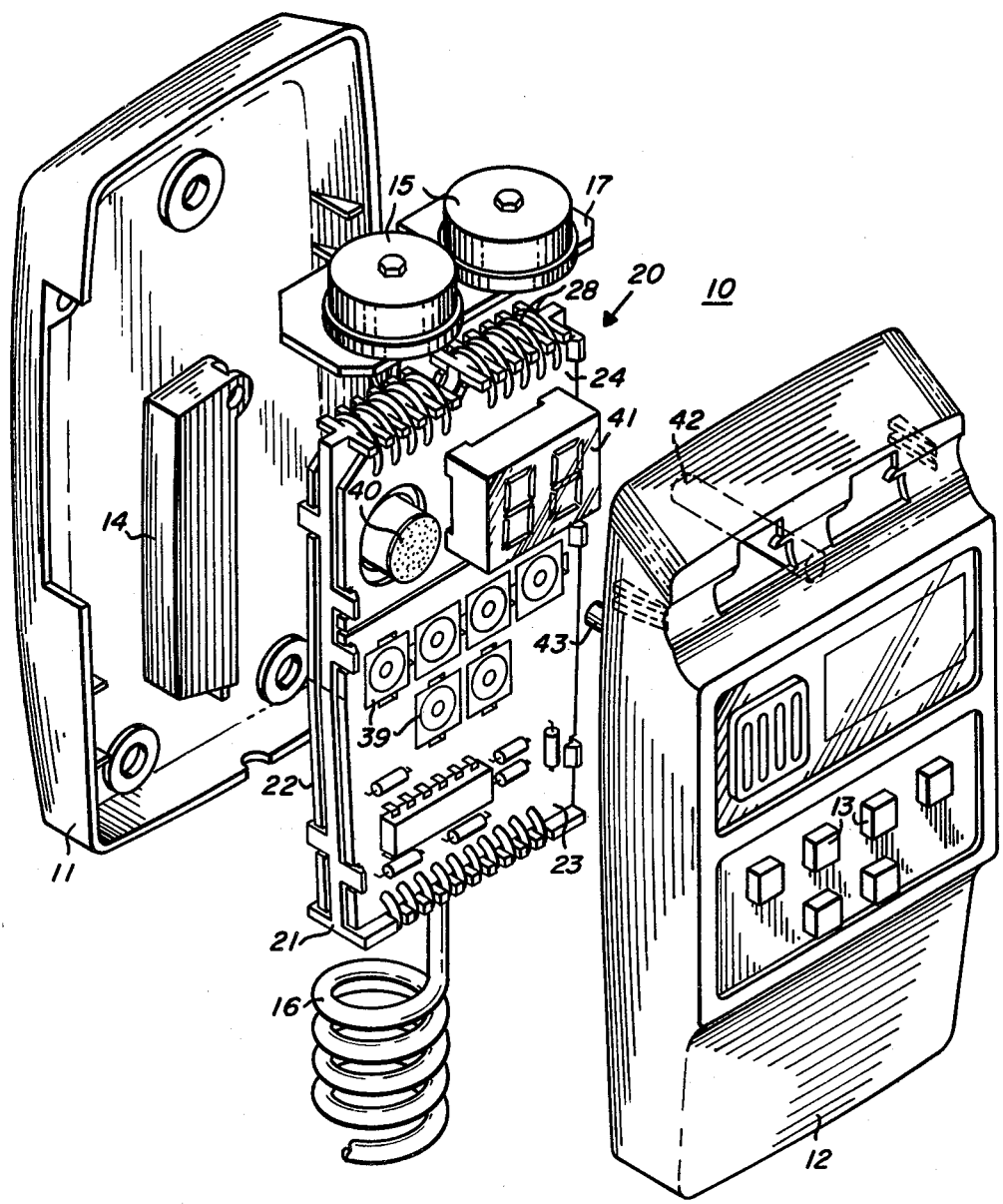
FIG. 1 is an exploded perspective view of a microphone assembly utilizing the improved printed circuit board assembly of the present invention.
Figure 2:
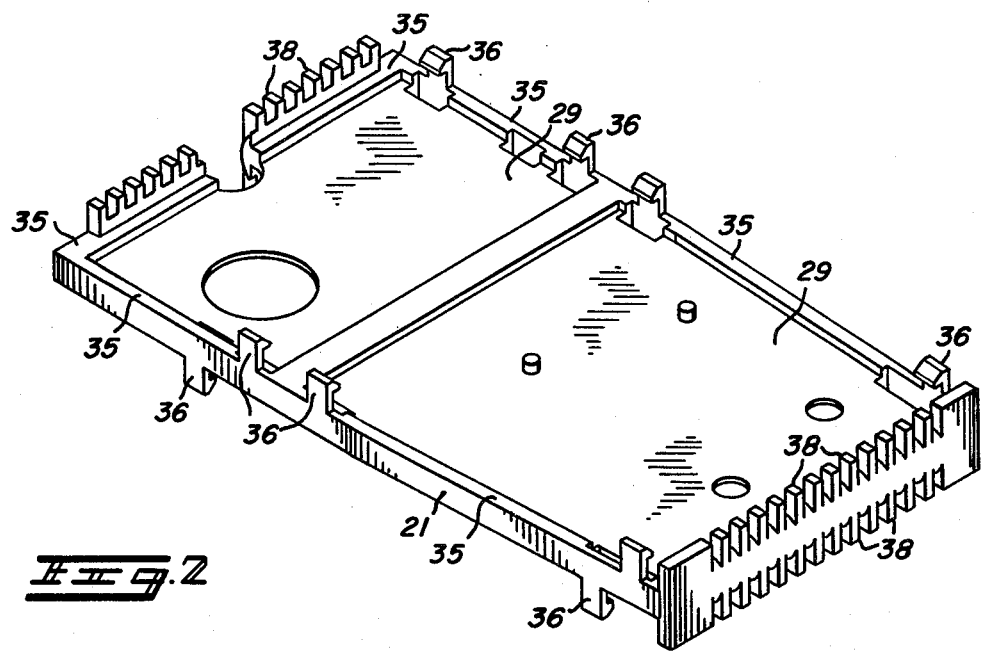
FIG. 2 is a perspective view of a printed circuit board carrier utilized by the printed circuit board assembly of the present invention.

FIG. 1 illustrates a microphone assembly 10 which essentially comprises a microphone rear housing 11, a mating front microphone housing 12 having pushbuttons 13 mounted thereon, a pivotally actuable push-to-talk actuator 14 intended for mounting in the microphone assembly 10, a pair of manually adjustable thumb wheel potentiometers 15 serving as manual controls for the microphone assembly 10 and a printed circuit board assembly 20 constructed according to the teachings of the present invention. The assembly 20 is connected to a transceiver chassis via a standard electrical multiconductor cable 16 and it is contemplated that the thumb wheel controls 15 are mounted on a separate printed circuit board 17 which is electrically connected to the assembly 20 via standard insulated wires which are soldered to conductive metalizations on printed circuit boards.

The essence of the present invention resides in the construction of the printed circuit board assembly 20 which comprises a printed circuit board carrier 21 that receives a first substantially planar printed circuit board 22 on one side of the carrier and receives a second printed circuit board 23 and a third printed circuit board 24 on the other side of the carrier 21.

Figure 3:
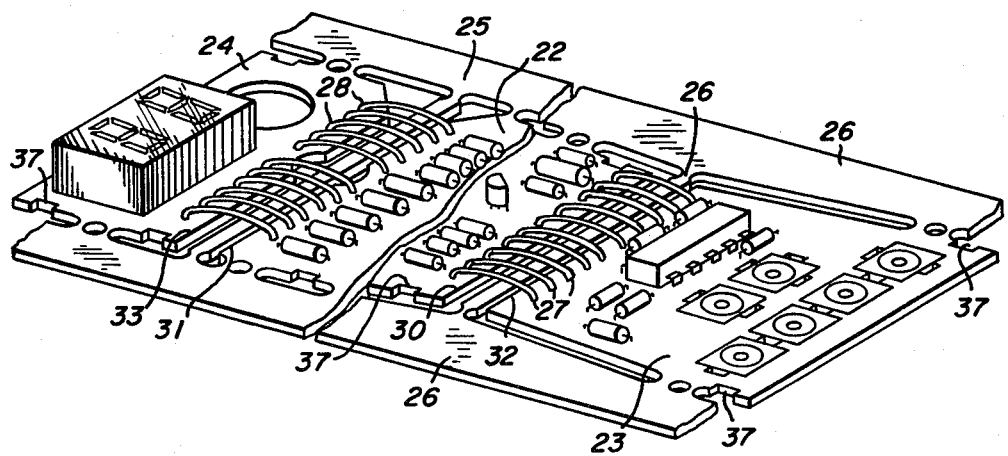
FIG. 3 is a perspective view of a master printed circuit board with components thereon, wherein the master printed circuit board is utilized to form a plurality of individual electrically interconnected printed circuit boards for mounting on the carrier shown in FIG. 2.

Initially, the individual printed circuit boards 22, 23 and 24 are all coplanar parts of a master break away printed circuit board 25 in which the circuit boards 22 through 24 are mechanically coupled together by preformed circuit board runners 26 which are intended for subsequent break away. FIG. 3 best illustrates this structure. Each of the circuit boards 22-24 is substantially planar and has top and bottom surfaces with the top surfaces of these boards being visible in FIG. 3. Some non-planar electrical components are mounted on the top surface of each of the circuit boards 22-24, and these non-planar components can comprise resistors, capacitors and various other electrical components. At least the bottom surfaces of each of the circuit boards 22-24 have conductive metallizations (not shown) thereon which interconnect the electrical components mounted on the top surfaces.

Electrical connections between the first printed circuit board 22 and the second and third printed circuit boards 23 and 24 are provided by first and second pluralities of bare jumper wires 27 and 28. These jumper wires 27 and 28 comprise uninsulated (bare) radial wires which extend between adjacent end portions 30 and 31 of the first circuit board 22 and corresponding adjacent end portions 32 and 33 of the circuit boards 23 and 24, respectively. Preferrably components and the jumper wires 27 and 28 are inserted in the master circuit board 25 which is then wave soldered to connect these components and jumper wires to conductive metalizations on the circuit board 25. It is then contemplated that the break away runners 26 of the master printed circuit board 25 will be removed and that the jumper wires 27 and 28 will provide the electrical interconnections between the separate circuit boards 22-24.

The printed circuit board carrier 21 is substantially planar and is formed with raised peripheral shoulders 35 which substantially surround and thereby effectively define a planar central portion 29 of the carrier 21. The circuit boards 22-24 are to be mounted on the printed circuit board carrier 21 with peripheral portions of the circuit boards 22-24 resting on the raised peripheral shoulders 35 of the carrier 21.

Integral retaining tangs 36 are provided on the carrier 21 and project outward from the raised peripheral shoulders 35 and perpendicular to the central planar portion 29. These tangs are utilized to fix each of the circuit boards 22-24 to the circuit board carrier after the removal of the mechanical runners 26 from the master circuit board 25. The retaining tangs 36 are positioned within peripheral notches 37 in the circuit boards 22-24 to thereby minimize the lateral dimensions of the circuit board assembly 20 as well as aid in properly positioning the circuit boards 22-24 on the carrier 21. Using peripheral mounting structures leave more of the central area of the circuit boards 22-24 available for circuitry utilization and simplifies circuit design layout for the boards 22-24.

The carrier 21 has two pluralities of integral, individual spaced projections 38 extending from the carrier at opposite ends thereof wherein these projections form integral guide portions on the carrier 21 for the jumper wires 27 and 28. The projections 38 form a plurality of notches therebetween and each of the jumper wires 27 and 28 is positioned in an associated one of the notches formed by the projections 38 when the circuit boards 22-24 are mounted to the carrier 21. Preferably, the carrier projections 38 forming the notches extend above the carrier raised peripheral shoulders 35 and extend substantially perpendicular to the plane of the circuit boards 22-24 after they are mounted to the carrier 21. In this manner, the projections 38 assist in locating the individual jumper wires of the pluralities 27 and 28 in their appropriate associated notches.

Preferably the carrier 21 is formed from a molded plastic and the retaining tangs 36 and end projections 38 are integrally formed therewith. In this manner a simplified printed circuit board carrier 21 has been provided which not only provides a mounting structural support for the circuit boards 22-24, but also provides end guide projections 38 which aid in ensuring that the jumper wires 27 and 28 do not short together. The projections 38 also aid in the manufacturing of the assembly 20 since they assist in locating the bare jumper wires 27 and 28 in their associated notches.

To manufacture the printed circuit board assembly 20 shown in FIG. 1, the following assembly method is utilized. After providing the master circuit board 25 with components and the pluralities of jumper wires 27 and 28, the master circuit board is wave soldered. Subsequently the break away runners 26 are removed and then the first printed circuit board portion 22 is affixed to one side of the circuit board carrier 21 by the retaining tangs 36. Then each of the circuit boards 23 and 24 are rotated through substantially 180 degrees of rotation with respect to the circuit board 22 and carrier 21. This results in effectively folding over the circuit boards 23 and 24 on top of the circuit board 22 with the pluralities of jumper wires 27 and 28 being spaced apart by the guide projections 38 formed at the ends of the carrier 21. It is contemplated that after the rotation of the end circuit boards 23 and 24, these boards will be fixed to the carrier 21 by their cooperation with corresponding retaining tangs 36. The resultant end structure is shown in FIG. 1 wherein the second and third circuit boards 23 and 24 are coplanar and parallel to the plane of the first circuit board 22. The bottom surfaces of the circuit boards 23 and 24 are spaced apart from and face the bottom surface of the circuit board 22 by means of the printed circuit board carrier 21. This resultant structure utilizes a minimum volume within the chassis of the microphone 10. In addition, no expensive flat printed cable connections are utilized for interconnecting the separate circuit boards 22-24 of the printed circuit board assembly 20.

To better understand the operation of the microphone assembly 10 shown in FIG. 1, it should be noted that actuator 14 cooperates with a switch (not shown) mounted on the top surface of circuit board 22, and that dome switches 39 on circuit board 23 cooperate with the pushbuttons 13. Also, a transducer 40 is mounted on the bottom surface of circuit board 22 and protrudes through openings in the carrier 21 and circuit board 24, and circuit board 24 carries a channel display 41. An insulated mounting post 42 on the front housing 12 separates the circuit board 17 from the jumper wires 28, and a post 43 on the housing 12 forms the pivot for the actuator 14.

While I have shown and described a specific embodiment of this invention, further modifications and improvements will occur to those skilled in the art. All such modifications which retain the basic underlying principles disclosed and claimed herein are within the scope of this invention.

I claim:

1. A circuit board assembly comprising:
   at least first and second substantially planar circuit boards having conductive metallizations thereon, each of each circuit boards having a top surface and a bottom surface, some non-planar electrical components mounted on the top surface of each circuit board;
   an electrically insulated circuit board carrier having raised peripheral shoulders substantially surrounding an effective planar central portion of said carrier, said first and second circuit boards mounted substantially back to back on said raised peripheral shoulders such that said bottom surfaces of said circuit boards are spaced apart from and face each other; said first and second circuit boards electrically interconnected by a plurality of jumper wire elements extending therebetween and soldered to adjacent end portions of each of said first and second circuit boards, and
   wherein said circuit board carrier has a guide portion formed therein at an end of said carrier adjacent to said adjacent end portions of said first and second circuit boards, said guide portion comprising a plurality of individual spaced projections extending from said adjacent end of said circuit board carrier, said projections forming notches therebetween with each of said jumper wire elements positioned in an associated one of said notches and therefore being spaced apart by said projections, whereby a compact, inexpensive circuit board assembly is provided.

2. A circuit board assembly according to claim 1 wherein said carrier includes a plurality of retaining tangs projecting outward from said raised peripheral shoulders of said carrier, some of said retaining tangs contacting each of said first and second circuit boards and thereby affixing said boards to said carrier.

3. A circuit board assembly according to claim 2 wherein said retaining tangs are positioned within peripheral notches in said first and second circuit boards to thereby minimize the lateral dimensions of said circuit board assembly and aid in positioning said circuit boards on said carrier.

4. A circuit board assembly according to claim 2 wherein said retaining tangs and guide portion are integrally formed with said circuit board carrier.

5. A circuit board assembly according to claim 4 wherein said integral circuit board carrier is formed from molded plastic.

6. A circuit board assembly according to claim 1 which includes a third circuit board mounted substantially coplanar with said second circuit board on said circuit board carrier, said third circuit board also having top and bottom surfaces with said top surface having some non-planar electrical components mounted thereon, said third circuit board mounted to said carrier such that it is positioned substantially back to back with said first circuit board with the bottom surfaces of said first and third circuit boards facing each other and spaced apart by said circuit board carrier.

7. A circuit board assembly according to claim 6 wherein said third circuit board is electrically interconnected with said first circuit board by a plurality of jumper wire elements extending therebetween and soldered to adjacent end portions of said first and third circuit boards and wherein said circuit board carrier has a second guide portion comprising a plurality of projections extending from an end of said carrier adjacent to said adjacent end portions of said first and third circuit boards, these projections forming notches therebetween with said jumper wires interconnecting said first and third circuit boards being positioned in associated ones of said notches and therefore being spaced apart from each other by said projections.

8. A circuit board assembly according to claim 7 wherein said circuit board carrier includes retaining tangs for contacting and mounting said third circuit board to said carrier.

9. A circuit board assembly according to claim 8 wherein said third circuit board has peripheral notches formed therein and said tangs which mount said third circuit board to said carrier are positioned in said peripheral notches in said third circuit board thereby mounting said third circuit board to said carrier and aiding in the positioning of said third circuit board on said carrier.

10. A circuit board assembly according to claim 1 wherein said carrier projections forming said carrier notches extend above said carrier raised peripheral shoulders and extend above and substantially perpendicular to the plane of said circuit boards whereby said projections assist in locating said jumper wires in said associated notches.

* * * * *